United States Patent
Paltrier et al.

(10) Patent No.: US 8,784,560 B2
(45) Date of Patent: Jul. 22, 2014

(54) METHOD FOR PRODUCING A CRYSTALLIZED SEMICONDUCTOR MATERIAL

(75) Inventors: Sylvain Paltrier, Voreppe (FR); Thierry Miguet, Entre-deux-Guiers (FR)

(73) Assignee: Societe Francaise de Detecteurs Infrarouges-Sofradir, Chatenay Malabry (FR)

( * ) Notice: Subject to any disclaimer, the term of this patent is extended or adjusted under 35 U.S.C. 154(b) by 827 days.

(21) Appl. No.: 13/028,272

(22) Filed: Feb. 16, 2011

(65) Prior Publication Data

US 2011/0203516 A1 Aug. 25, 2011

(30) Foreign Application Priority Data

Feb. 19, 2010 (FR) ...................................... 10 00695

(51) Int. Cl.
  *C30B 11/00* (2006.01)
(52) U.S. Cl.
  CPC ............... *C30B 11/00* (2013.01); *C30B 11/003* (2013.01); *C30B 11/006* (2013.01)
  USPC .................... 117/77; 117/11; 117/73; 117/78; 117/81; 117/82
(58) Field of Classification Search
  CPC ...... C30B 11/00; C30B 11/003; C30B 11/006
  USPC ..................... 117/11, 73, 77–78, 81–82, 937, 117/956–957
  See application file for complete search history.

(56) References Cited

U.S. PATENT DOCUMENTS

| 3,933,435 A | 1/1976 | Menashi et al. |
| 4,190,486 A * | 2/1980 | Kyle .............................. 438/502 |
| 4,728,388 A * | 3/1988 | Fillot et al. ...................... 117/42 |
| 5,603,763 A | 2/1997 | Taniguchi et al. |

OTHER PUBLICATIONS

Li Wanwan et al—"Study on the effect of Cd diffusion annealing on the electrical properties of CdZnTe"—Journal of Crystal Growth 292, 2006.
Vydyanath et al—"Recipe to minimize Te precipitation in CdTe and (Cd,Zn)Te crystals"—J ; Vac. Sci. Technol. B 10 (4)—Jul./Aug. 1992.
Nesmeyanov—"Vapor Pressure of the Chemical Elements"—Edit. R. Gary, Elsevier Publishing Company, 1963 [Title page and two relevant pages provided.].
Search Report for French Application No. 1000695, dated Jul. 30, 2010.

* cited by examiner

*Primary Examiner* — Michael Kornakov
*Assistant Examiner* — Kenneth A Bratland, Jr.
(74) *Attorney, Agent, or Firm* — Heslin Rothenberg Farley & Mesiti P.C.

(57) ABSTRACT

A method for producing a crystallized compound semiconductor material comprises synthesizing said material by fusion and inter-reaction of its constituents placed in elementary form constituting a charge into a sealed ampoule, and then crystallizing the resulting material in liquid form by cooling. Also including: increasing, within the charge, proportion of one constituent beyond the stoichiometric proportions of the material, thereby defining an excess of the one constituent; subjecting the entire sealed ampoule to a temperature higher than or equal to fusion temperature of the material; subjecting the ampoule to a low temperature gradient and to a gradual drop in temperature, to induce crystallization of the resulting material in liquid form, in stoichiometric proportion; subjecting part of the ampoule where the crystallized material is not present, to a significant drop in temperature modifying vapor pressure state of the excess to a saturated vapor state; and cooling the whole assembly down to ambient temperature.

5 Claims, 3 Drawing Sheets

METHOD FOR PRODUCING A CRYSTALLIZED SEMICONDUCTOR MATERIAL

CROSS REFERENCE TO RELATED APPLICATIONS

This application claims priority of French Patent Application No. 1000695 filed on Feb. 19, 2010, the entire disclosure of this application being hereby incorporated herein by reference.

FIELD OF THE INVENTION

The invention relates to a method for producing a crystallized semiconductor material, particularly one from group II-VI of the periodic table of elements.

It applies in particular to the production of such semiconductor materials, be they binary such as CdTe or ZnTe, or ternary with the formula $Cd_xZn_{1-x}Te$, where x is able to assume any values between zero and one, and conventionally identified by the generic formula CdZnTe or again $CdTe_ySe_{1-y}$, where y is able, here too, to assume any values between zero and one, or even quaternary with the generic formula $Cd_xZn_{1-x}Te_ySe_{1-y}$.

In a general way, the invention applies to the preparation of such semiconductor materials in a sealed ampoule in inert or reducing gas ($H_2$), or again under a vacuum, using the BRIDGMAN technique for example. The method of growth implemented is not a decisive factor in the context of this invention.

The materials so obtained are more specifically intended for use as a substrate for the epitaxy of semiconductor compounds of generic formula CdHgTe, well known in the production of infra-red detectors.

The materials in question are also known for being used in the production of X-ray or gamma (γ) ray detectors, and ionizing radiation detectors generally.

PRIOR ART

There is an ever-growing demand for single-crystal semiconductor materials of sufficiently large size, given the large number of planned uses. In fact producing materials of such sizes is antinomical to production that is satisfactory on the economic level.

Among the difficulties encountered may be mentioned the low thermal conductivity of these materials, which impedes the removal of the calories generated by crystallization, and leads to growth interface forms unfavorable to single crystallization.

Then, since the components of said materials are fairly volatile elements, particularly cadmium or selenium, it is necessary to carry out the growth operations in sealed, leak-tight ampoules, mainly made out of silica glass.

Furthermore, one major difficulty in producing these materials, which are discrete compounds, lies in controlling their stoichiometry when they are being prepared.

This failure to control causes precipitation of the excess component, inducing various associated disorders, including in particular perturbation of the crystal ordering or opacity of the material where these flaws occur, an opacity that is totally unacceptable for some uses, such as in particular infrared windows, infrared lenses, and especially the use as transparent substrates for the epitaxy of thin films of CdHgTe intended for the preparation of infrared machine vision components.

To be free of these difficulties, two different courses of action have been proposed hitherto.

The first course of action comprises effecting a stoichiometric correction after the material is produced. Defects in stoichiometry, coming mainly in the form of precipitates, are corrected by subjecting the material to annealing under controlled pressure of one of the constituents.

A satisfactory proposal has thus been made for the elimination of tellurium precipitates by cadmium vapor annealing. For example, the publication by Li WANWAN et al—"Study on the effect of Cd diffusion annealing on the electrical properties of CdZnTe"—Journal of Crystal Growth 292 (2006), makes it clear that it is difficult to correctly control the pressure of the cadmium during growth, and that a subsequent treatment is required, in the case in point by Cd diffusion annealing. The publication by H. R. VYDYANATH et al—"Recipe to minimize Te precipitation in CdTe and (Cd, Zn)Te crystals"—J ; Vac. Sci. Technol. B 10(4)—Jul/aug 1992 also advocates a subsequent treatment on wafers so as to reduce the tellurium precipitates.

Experience shows however that if this technical solution of annealing on wafers or on an ingot itself does prove to be really effective in terms of the disappearance of the excess element, it has no effect on the crystallographic perturbation previously induced by the precipitates, a perturbation which persists.

The second course of action proposed involves earlier intervention, in the material growth process itself.

According to this course of action, a method such as that described in the document U.S. Pat. No. 4,190,486 comprises placing in the growth ampoule an auxiliary reservoir containing in liquid state the most volatile element of the semiconductor material to be produced, for example the cadmium, in an area at significantly lower temperature than that of the area of the ampoule accommodating the charge in the process of crystallization, the latter typically being subjected to a temperature in the vicinity of 1,100° C. for compounds such as CdTe or CdZnTe.

Controlling the temperature of the area of the ampoule containing the auxiliary reservoir with the most volatile element in the liquid state allows the vapor pressure established, in the case in point saturated vapor pressure, and consequently, the stoichiometry of the material in the process of crystallization, to be set in a controlled way.

The principle employed is shown in relation to FIG. 1.

According to the teachings of this document, the stoichiometry of the material is satisfactorily controlled.

However, it is essential in using the method for the growth ampoule to be charged on the one hand with CdTe compound for crystallization, and not with the elementary constituents thereof, and on the other hand, with the element whose saturated vapor pressure is required to control, placed for example in an auxiliary reservoir.

Indeed, it is not conceivable to charge the simple elements, Cd and Te for example, and to synthesize them in order to obtain the compound CdTe. Said synthesis in fact requires the temperature of the ampoule to be raised at least to the fusion point temperature of the compound CdTe ($\approx 1,100°$ C.), and for this to be done in a substantially isothermic way throughout the volume of the ampoule, in order to avoid bringing about the condensation of said compound in the part of the ampoule, which would otherwise be in a colder area. At such a temperature of 1,100° C. prevailing throughout the volume of the ampoule, the saturated cadmium vapor pressure would reach about 10 bars, incompatible with the mechanical strength of said ampoule.

This pre-supposes therefore, in the first place, that the semiconductor compound CdTe has been previously synthesized, then removed from the mold, and finally recharged into a new ampoule so that it can be fused and re-crystallized under controlled saturated vapor pressure of the most volatile element, in order to obtain the required stoichiometry.

It will be easily understood that these different steps involve a long, complex, and expensive process, further dictated by the conditions of synthesis itself, which, since it has to be carried out in a substantially isothermic way at a temperature higher than the fusion temperature of the compound for synthesis, and in the case in point 1,100° C. for the compound CdTe, rules out the presence of any great excess of a volatile element on account of the resulting high pressure and the inability of the ampoule to resist it.

It will be understood in fact that the method described in this document is not under any circumstances suitable for an industrial implementation of the principle advocated, in any case one that is satisfactory in economic terms.

Also described in the document U.S. Pat. No. 5,603,763 is a method for growing a single-crystal semiconductor material. This document also advocates using an auxiliary reservoir, intended to receive a volatile element, as well as a crucible, which is absolutely essential for accommodating the constituents of said material. In the method so described, the saturated vapor source of said volatile element is, here too, positioned on the side opposite the point of departure of the growth of the single crystal. This configuration is made imperative on account of the thermal disturbances engendered by the relatively low temperature of the liquid saturated vapor source.

It will be noted therefore that the prior art proposes the implementation of an excess of one of the elementary constituents in gaseous form and in the saturated vapor state.

The set aim of this invention is to considerably simplify the aforementioned methods, here too, by playing on the conditions of synthesis of the semiconductor material, and by getting rid of the perturbations inherent in said methods.

DISCLOSURE OF THE INVENTION

Thus, and according to the invention, the method for producing a crystallized compound semiconductor material, and in particular one from group II-VI, comprises synthesizing said material by fusion and mutual reaction of the constituents thereof up to the fusion temperature of the compound, said constituents being placed in the elementary state in the form of a charge in a sealed ampoule in inert or reducing gas or under vacuum, and then crystallizing the semiconductor material resulting from this operation then in liquid form by cooling the ampoule according to a given temperature gradient.

According to the invention, the method further comprises:
  increasing within the charge the proportion of one of the constituents of the material beyond the stoichiometric proportions of the compound semiconductor material for synthesis, thereby defining an excess of one of said constituents;
  subjecting the sealed ampoule in its entirety so provided with the charge to a temperature higher than or equal to the fusion temperature of the compound semiconductor material for synthesis, inducing on the one hand, the actual fusion of the charge and the inter-reaction of its constituents then in liquid form, and on the other hand, the conversion to dry vapor of the excess of the excess constituent;
  then subjecting the ampoule to a low temperature gradient and to a gradual lowering of said temperature, likely to induce the crystallization of the resulting semiconductor material then in liquid form and in stoichiometric proportion, the excess of the excess constituent remaining in dry vapor form;
  then, after crystallization and the beginning of cooling of the semiconductor material, subjecting the part of the ampoule where the crystallized semiconductor material is not present, to a significant drop in temperature capable of modifying the vapor pressure state of the excess of the excess constituent in order to convert it into saturated vapor;
  and finally, cooling the whole assembly down to ambient temperature.

In other words, the invention comprises charging the ampoule with excess of one of the constituents of the compound semiconductor material it is required to produce, in such a way that subsequent to the rise in temperature likely to induce the fusion of the mixture, the reaction of its constituents and the formation of said semiconductor material then in liquid form, there is generated within the ampoule a dry vapor pressure of said excess constituent, likely to lead, during the subsequent crystallization phase, to a difference to the required strict stoichiometry of the material, without however reaching too high a pressure value, that might break the ampoule, and then subjecting an area of the ampoule to a significant reduction in temperature at least during a part of the solid cooling phase so as to induce the change in nature of the pressure of said excess constituent in order to bring about its condensation (saturated vapor) and consequently, provide later support for cooling under the selected pressure conditions, in such a way as to control the stoichiometry of the then crystallized material in the process of cooling, as is the case with the prior art as described (Cf. above).

Put yet another way, during the step of heating the ampoule, particularly to a temperature close to the melting temperature of the semiconductor compound to be produced, the quantity of the excess element on the one hand, and the laws of thermodynamics on the other hand, ensure that said excess of excess constituent then comes in the form of dry vapor, with pressure compatible with the mechanical strength of the ampoule, and not in the form of saturated vapor, with pressure incompatible with said mechanical strength. Thus, the pressure of the excess quantity of the excess element grows with the temperature in a linear way (in accordance with the Boyle-Mariotte law), and not exponentially, as is well known to those skilled in the art as well as from the specialist literature, and particularly "VAPOR PRESSURE OF THE CHEMICAL ELEMENTS" by A. N. NESMEYANOV—Edit. R. GARY, Elsevier Publishing Company. In doing this, the pressure inside the sealed ampoule, remains manageable, and at all events below the pressure capable of causing it to burst, in so far as said excess quantity remains small.

In doing this, there is a sufficient quantity available in the elementary state of one of the elements forming a constituent part of the semiconductor compound material to be produced, capable of intervening subsequently, in other words when cooling the ampoule and therefore the contents thereof, and consequently, after the crystallization of said material, in order to optimize the stoichiometry and electronic properties thereof (filling any gaps or vacancies for example), without coming up against the drawbacks of the prior art, and in particular, without having to generate beforehand a charge of said semiconductor material to be produced, but starting directly from its elementary constituents.

In a known way, the mutual reaction of the constituents forming a constituent part of the semiconductor material, comprises moving from the juxtaposition of said elementary and independent constituents at zero degrees of oxidation, carrying no electric charges, to a defined compound, whereof the metal is a cation and the metalloid an anion, even in the liquid state.

Simply bringing these constituents into contact in the elementary state, preferably in the molten state, produces the lively exothermic reaction in the constitution of the semiconductor material.

Apart from the fact that the dry vapor of the excess element or constituent allows the pressure borne by the ampoule to be moderated in an adaptable way, its value may be selected by applying the Boyle-Mariotte law during crystallization and at the start of cooling so as to confer on the material any property dependent on this parameter (transparency, electrical properties, etc.)

According to the invention, the choice of excess constituent falls on the one that is best adapted to obtaining the properties sought: optical properties (transparency, precipitates), electrical properties: P-type or N-type, high or low resistivity, etc.

According to one advantageous but non-imperative inventive feature, the ampoule in question comprises two areas that have two different diameters:

- an area of larger diameter, intended to act as a place for receiving the charge to be crystallized;
- an area of smaller diameter, in continuity with the area of larger diameter, intended to be subjected to localized temperature management and consequently to the change in nature, from dry vapor to saturated vapor, of the vapor of the excess constituent.

Typically, in the case of alloys such as CdZnTe prepared under controlled cadmium pressure, the pressure of the vapor during the growth phase is close to 1.5 bars ($1.5 \cdot 10^5$ Pa). Quite clearly this value is variable as a function of the mechanical strength characteristics of the ampoules, in terms of diameter and thickness of the walls defining it.

According to the invention, the excess of excess constituent is at most equal to the quantity that corresponds to the establishment, at a temperature slightly higher than or equal to the fusion temperature of the compound semiconductor material to be produced, of a high pressure of said constituent, then in dry vapor form, lower than the bursting pressure of the ampoule, this quantity being determined by applying the Boyle-Mariotte law. Slightly higher is taken simply to mean at most a few tens of degrees, and typically 20 degrees. Incidentally, there is no reason to overly increase the temperature of the ampoule above the melting temperature of the compound material to be produced, except to ensure the complete fusion of said material.

According to the invention, the materials in question are binary compounds such as CdTe or ZnTe, or ternary materials with the generic formula CdZnTe, CdTeSe, or again quaternary materials with the generic formula CdZnTeSe.

DESCRIPTION OF THE FIGURES

The manner in which the invention may be implemented, and the resulting advantages, will become clearer from the following embodiment given by way of information and non-restrictively supported by the appended figures.

DETAILED DESCRIPTION OF THE INVENTION

Figure 1:
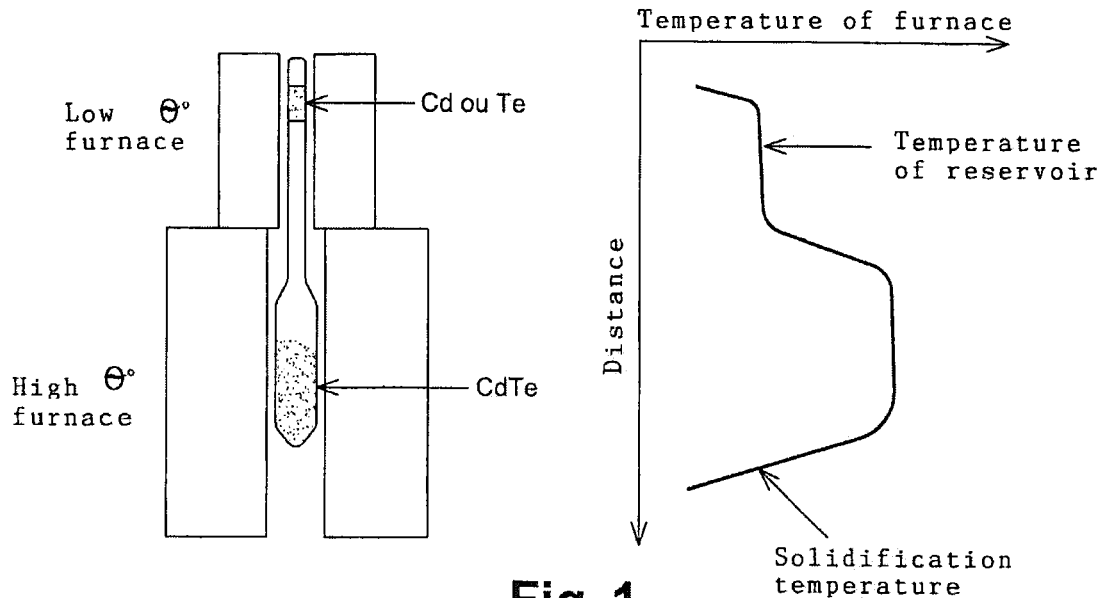
FIG. 1 is a diagrammatic representation of the principle employed in the prior art.

The following description is more specifically targeted at the formation of a semiconductor material such as CdTe. It is well understood however that the method described may be applied to other compositions, particularly binary compositions and for example ZnTe, ternary compositions such as CdZnTe or CdTeSe, or quaternary compositions such as CdZnTeSe.

Likewise, this description is more specifically targeted at the growth of the material CdTe under controlled cadmium pressure. There is nothing however to prevent this same preparation from being developed under controlled tellurium pressure.

Furthermore, the inventive method, as described hereinafter, implements the crystal growth of single-crystals by the so-called BRIDGMAN method or similar methods in a sealed ampoule 1.

The BRIDGMAN method, illustrated furthermore in the aforementioned document U.S. Pat. No. 4,190,486, comprises growing materials placed in a sealed ampoule, said ampoule then being heated and then cooled according to a temperature gradient so that said materials come to be in liquid phase in the upper part of the ampoule, with the crystallized material present in the lower part of the ampoule.

It is known however that it is possible to carry out this type of growth by starting it on the surface of the liquid bath and continuing it in the direction of the bottom of the ampoule. Nonetheless, whatever method is selected, it has no effect upon the implementation of the invention.

The ampoule 1 is placed in a temperature-controlled furnace, or even into an unit formed by combining two furnaces placed side by side. It is then drawn downwards from the hot area to the cold area in order to bring about the crystallization. Alternatively, the ampoule may remain fixed, and crystallization then results from moving the temperature gradient. Here too, these methods are not constituent parts of the invention.

The ampoule is then broken in order to recover the crystal.

The invention initially comprises placing in the ampoule 1 a charge containing the elementary constituents of the semiconductor material to be produced, in the case in point cadmium and tellurium. These constituents come in the form of ingots. Care is taken to place in said charge one of the constituents, and for example the most volatile, in excess, in the case in point the cadmium, relative to the quantities necessary to produce the required stoichiometry of the crystallized semiconductor it is wished to obtain, and constituted in fact by an equi-atomic mixture of the metal (Cd) and metaloid (Te). If admittedly this mixture does have to be carefully weighed, it does not however require extreme precision, in so far as the system veers in practice towards equilibrium.

This excess mass is determined by applying the well-known Boyle-Mariotte law:

$$P \times V = N \times R \times T$$

an expression wherein:
P denotes the dry vapor pressure of the excess constituent;
V denotes the gaseous volume (total volume of the ampoule reduced by the volume of the solid);
N denotes the quantity of matter in gram-molecules of the excess constituent;
R is the constant of the ideal gases;
and T denotes the temperature.

One of the difficulties of the invention is how to determine this quantity of excess cadmium in such a way that the pressure resulting from converting the cadmium excess into vapor within the ampoule is somewhere between two values:
a maximum value lower than the bursting pressure of the ampoule;
a minimum value higher than the saturated vapor pressure of the cadmium it is required to establish within the ampoule in the process of cooling.

The reason for this range of values will be shown below.

In order to determine the maximum permissible quantity of the excess constituent, in the case in point cadmium, consideration is given to the maximum pressure $P_{max}$ permissible by the ampoule at the synthesis temperature, in other words at the high-temperature phase of the inventive method, in the case in point slightly higher than or equal to 1,092° C., and typically 1,100° C. substantially corresponding to the fusion temperature of the compound semiconductor material CdTe.

Quite clearly, this pressure depends eminently on the geometry of the ampoule, but also on the raw material thereof. These parameters constitute elements well-known to those skilled in the art who, in the end, apply a safety coefficient in order to prevent the ampoule from breaking Next to be determined is the free volume $V_{free}$ in the ampoule, in other words the total volume thereof, reduced by the volume of the bath 4 for crystallization, said bath itself being the result of the fusion of the charge.

A few uncertainties may remain in terms of the volume occupied by the bath, of the order of a few percentage points but however, the error induced in respect of the pressure does not then exceed this percentage.

It is then considered that the excess species in gaseous phase at the working temperature, in other words a maximum temperature slightly higher than or equal to 1,100° C. is a dry vapor. This is easily verified with reference to the specialist literature and for example "VAPOR PRESSURE OF THE CHEMICAL ELEMENTS" by A. N. NESMEYANOV—Edit. R. GARY, Elsevier Publishing Company.

A determination is then made of the maximum quantity $N_{max}$ of the excess of the excess constituent, and in this case cadmium, via the relation:

$$N_{max} = P_{max} \times V_{free} / R \times T_{synthesis} \quad (1)$$

an expression wherein $T_{synthesis}$ denotes said working temperature.

So long as the maximum permissible pressure $P_{max}$ is set with the required safety margin, the quantity $N_{max}$ of the excess of the excess volatile constituent is easily determined.

Similarly, the minimum quantity of the excess of the excess constituent is determined so as to be able to have said excess constituent available in the form of saturated vapor at the cold end 2 of the ampoule 1.

This quantity depends on the saturated vapor pressure of said constituent at a chosen so-called "cold point" temperature, in other words at a temperature that causes the nature of the pressure of the cadmium to switch from dry to saturated. This so-called "cold point" temperature is freely chosen to be between 400° C. and 800° C.

With the help of the gas state equation in accordance with the Boyle-Mariotte law, a determination is thus made of the quantity of excess matter, this quantity of matter having to be slightly greater than the value indicated by said equation, so that there is within the ampoule both a liquid phase of the cadmium, resulting from the condensation thereof and, a saturated vapor phase. To this end, the following relation is applied:

$$N_{min} = P_{sat} \times V_{free} / R \times T_{\text{"cold point"}} \quad (2)$$

The value of the saturated vapor pressure of the cadmium $P_{sat}$ also comes out of the relevant literature, as previously indicated.

Admittedly, in practice, the temperature gradient present in the ampoule during the crystallization phase induces a density gradient of matter in the gaseous phase. In doing this, the expression (2) does not offer a strict representation of reality. Nonetheless, integrating the Boyle-Mariotte law along a thermal, and for example linear, gradient, leads to a variation in the formula, according to the following expression:

$$N_{min} = \text{Log } T_{max}/T p_{sat} \times P_{sat} \times V_{free} / R \times (T_{max} - T p_{satt}). \quad (3)$$

The resulting correction made to the quantity of matter is in fact minimal.

Incidentally, the simplified formula (2) leads to an increase in the required minimum quantity of matter thereby increasing the security of the technical approach adopted under this invention.

Once this quantity of excess constituent is determined, and selected therefore to be between the two aforementioned values, it is added to the charge placed in the sealed ampoule.

The ampoule is subjected (FIG. 2) in its entirety, in other words the lower part 3 of larger diameter and the upper part 2 of smaller diameter, to a temperature slightly higher than or equal to 1,100° C., in other words higher than the melting temperature of the defined compound CdTe.

The next step is crystallization by slowly lowering the temperature, as well as subjecting the ampoule in its entirety to a low temperature gradient, typically 1° C./cm, leading to the switch to the solidification temperature, such that the surface 5 of the liquid bath 4 brings out the single crystal in the process of solidification, and does so until the whole charge is crystallized. All the liquid has by then disappeared within the ampoule. All that remains is the single crystal of CdTe and gaseous cadmium under dry vapor pressure.

Figure 5:
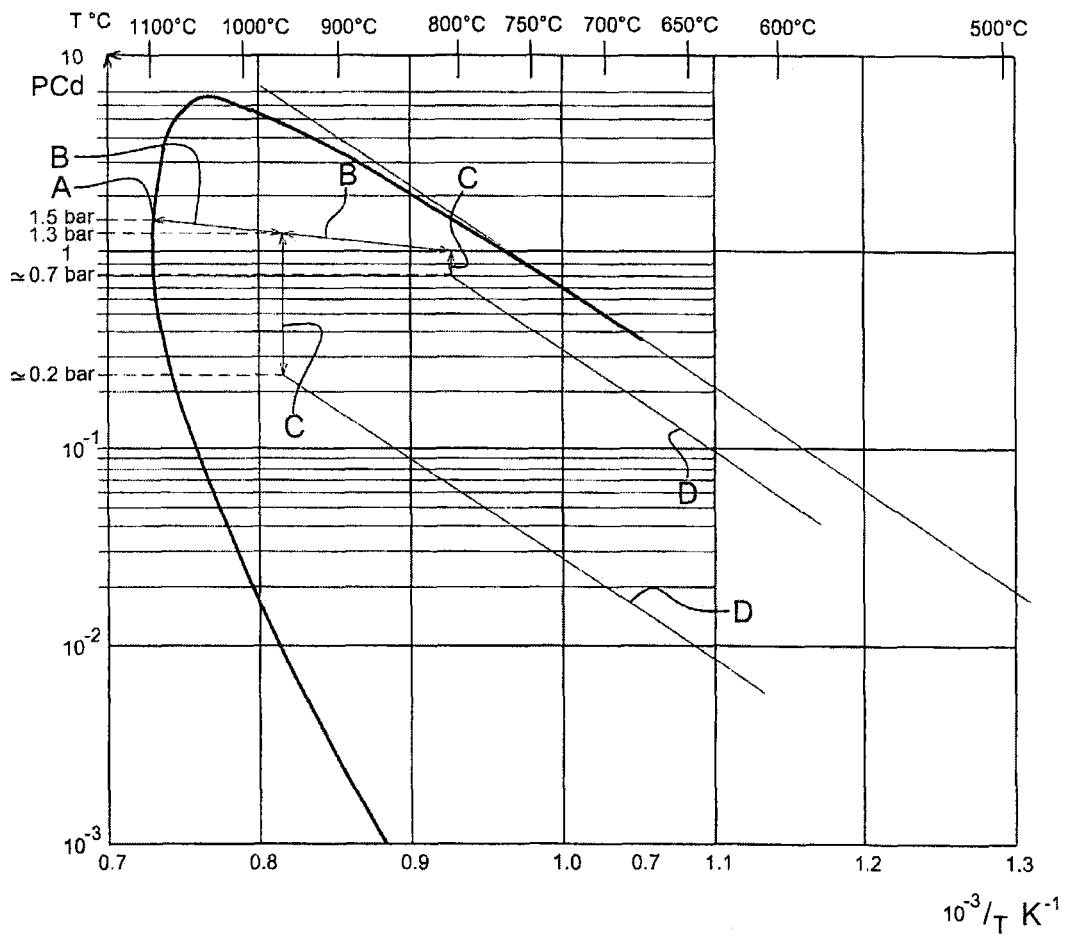
FIG. 5 shows a diagram of pressure/temperature phases for the compound CdTe, for the purpose of illustrating various possibilities of implementing the invention, by showing two examples of possible change in the cadmium pressure, firstly in dry vapor, and then saturated vapor form.

Because of the excess quantity of cadmium previously placed in the charge, there is created in the free volume of the ampoule a dry vapor pressure of cadmium typically of between 0.5 and 1.5 bars, and in the example described in relation to FIG. 5, exactly equal to 1.5 bars.

Because of the presence of this dry cadmium vapor within the ampoule, a further outcome inter alia is the filling of any gaps or vacancies that may form in the process of crystallization of the bath 4 in order to produce the required stoichiometry of the crystallized semiconductor material. This support for the crystallized solid by the cadmium vapor pressure during this first part of the cooling is illustrated by the curve B shown in FIG. 5. In fact, the slow lowering of temperature simultaneously causes a lowering of the pressure of the excess cadmium, linearly (and not exponentially, by virtue of the dry nature of the cadmium vapor).

Figure 3:
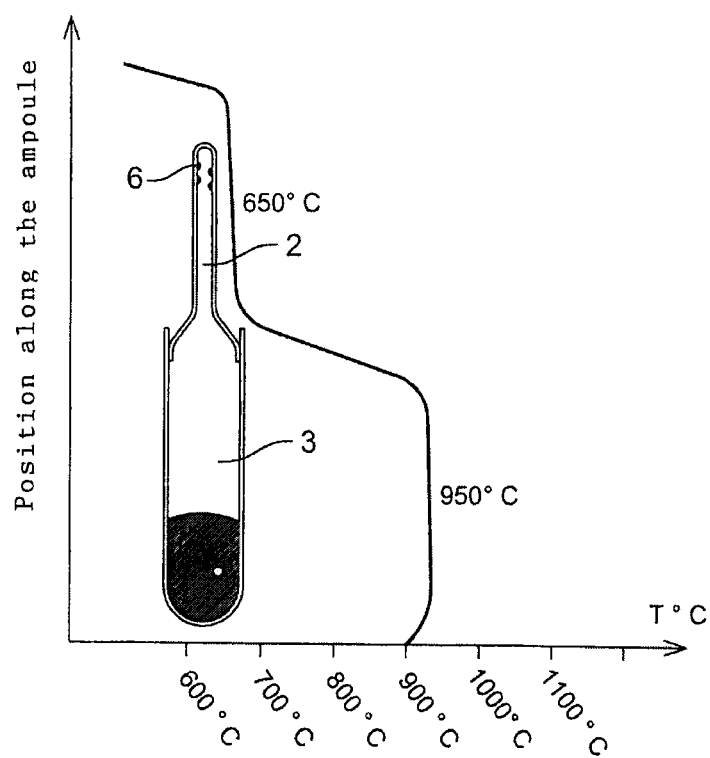
FIG. 3 is a view similar to FIG. 2 showing, during the solid cooling phase, the conversion of the nature of the vapor pressure of the constituent of said material whereof the pressure has been chosen to be controlled.

According to a first implementation of the inventive method, the temperature is left to drop down to about 950° C., and the next step is then (FIG. 3) to cool more thoroughly the area 2 of smaller diameter of the ampoule, in the case in point to a temperature close to 650° C.

By lowering the temperature in this area, the dry vapor pressure of cadmium drops in accordance with the Boyle-Mariotte law within the ampoule until it reaches the saturated vapor pressure, so that the excess cadmium condenses thereby forming droplets 6 within this area 2 of the ampoule. This then gives freedom, when it is required, from the risks of cadmium precipitates appearing within the single crystal of CdTe that may, as already indicated, impair the properties, particularly of transparency of said crystal. In the same way, by playing on the cadmium vapor pressure, it is possible to modulate the capacity for free carrier absorption by the crystallized compound semiconductor material, to play on the doping thereof, P-type or N-type, and also to modulate the resistivity thereof.

The cadmium vapor pressure then drops significantly, until it reaches a value close to 0.2 bars, and then decreases as the temperature of the entire ampoule drops, including therefore the "cold" area 2 of cadmium condensation.

To advantage, but without this being in any way mandatory, a temperature pause of a few hours may be applied, immediately after the switch to saturated vapor at 0.2 bars, before beginning to decrease said temperature.

If on the other hand, according to a second approach of the inventive method, we wait for the decrease in temperature to reach about 810° C. before cooling the area 2 of the ampoule, then the dry vapor pressure of the cadmium settles at about 1 bar. By lowering the temperature to about 740° C. in the area 2 of the ampoule, this pressure drops to 0.7 bars and becomes saturated.

Then, the cadmium pressure, then saturated, decreases as the temperature of the entire ampoule drops down to the ambient temperature.

These are the two tracks, C and D respectively, in FIG. 5.

It is easily understood that the drop in the pressure of the cadmium vapor within the ampoule is governed by the choice of the drop in temperature.

The cooling is then continued until it reaches the ambient temperature under selected saturated vapor pressure of the cadmium and finally, the ampoule is broken to recover the single crystal required.

NUMERICAL EXAMPLE

The ampoule 1 is typically made out of silica with an internal diameter of 90 mn closed by a silica plug extended by a tube 2 with an internal diameter of 24 mn.

The ampoule contains a charge consisting of 1461.343 grams of cadmium and 1,658.800 grams of tellurium, in other words a strictly stoichiometric charge 50% atomic cadmium/50%/atomic tellurium.

The entire assembly is intended to be subjected to a substantially uniform temperature profile until it reaches 1,100° C. This operation constitutes the synthesis phase.

If we take a liquid density of approximately in the vicinity of 5.75 g/cm$^3$, the volume of the charge is determined at 542.63 cm$^3$, thereby allowing a free volume equal to 1,138 cm$^3$ to be evaluated in relation to the dimensions of the ampoule.

Experience shows that with the ampoule of the type described, the risk of bursting or breaking would occur at a pressure in the vicinity of 4 bars.

Since we require for safety reasons a maximum pressure of cadmium in dry vapor form inside the ampoule equal to 1.5 bars, the expression (1) can then be used to determine the excess quantity of cadmium necessary at the value of 1.699 grams (about 1.7 g), which is added to the strictly stoichiometric charge mentioned above.

Figure 2:
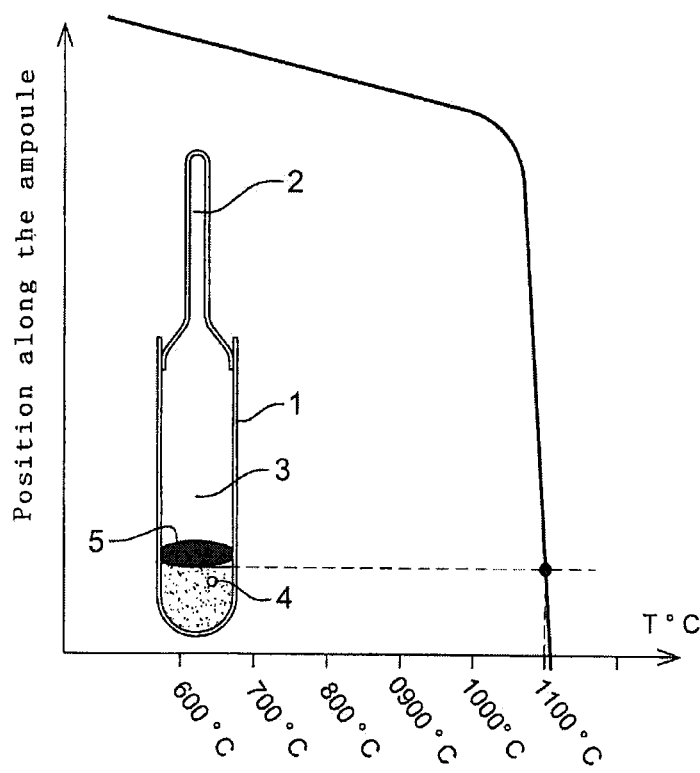
FIG. 2 is a diagrammatic representation for the purpose of showing the growth or crystallization phase of the inventive semiconductor material.

After adding this excess quantity, and after the synthesis phase, the ampoule is then subjected to a temperature profile according to a slight gradient of 1° C. per cm, hotter in the lower part 3 and less hot in the upper part 2, as is shown furthermore in FIG. 2. This low gradient is comparable to an isothermic configuration, particularly from the point of view of the subsequent temperature conditions.

According to these conditions, the entire ampoule, whether it be in the upper part 2 and all the more in the slightly hotter lower part 3, is occupied only by a dry cadmium vapor, with the exception however of the compound CdTe then liquid.

Slowly lowering the temperature of the assembly produces, as already stated, the crystallization of said compound CdTe starting from the surface of the liquid bath in the context of the example described, said crystallization being total when the bottom of the ampoule goes below 1,092° C., in other words the fusion/solidification temperature of the compound CdTe.

This drop in temperature is continued down to about 950° C. in the present case, the temperature at which a very significant cooling is then applied to the upper part 2 of small diameter of the ampoule.

This causes the condensation 6 of the excess cadmium and establishes a saturated and selected vapor pressure of said cadmium, which allows control of the required stoichiometry to be pursued, and prevents furthermore, in the present case, the formation of cadmium precipitates in the crystallized solid.

Since a saturated vapor pressure of 0.2 bars is required, the area 2 of the ampoule must be kept at about 650° C. according to the literature previously mentioned (A. N. NESMEYANOV).

The formula (2) has then been used, in a known way, to calculate the minimum quantity of excess cadmium leading to this saturated vapor pressure, in the case in point 0.33 grams.

It can thus be seen that the quantity of excess cadmium added to the charge, 1.699 grams (or about 1.7 g) is amply sufficient to allow the condensation of this element at 0.2 bars.

The ampoule and its charge are then cooled to the ambient temperature, either by keeping the temperature difference of 300° C. between the crystallized charge and the cold point 2 of the ampoule, or by applying a different procedure that brings about some change in this difference.

Figure 4:
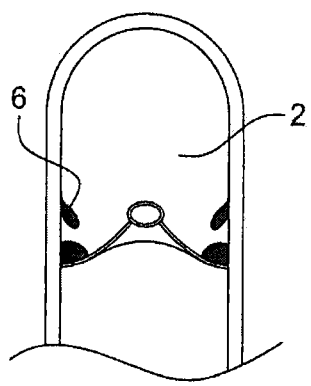
FIG. 4 is a diagrammatic representation of a detail in FIG. 3.

As may be observed from FIG. 4, the so-called cold end of the ampoule is, in respect of the present example, to advantage laid out so as to prevent the runoff of condensing cadmium towards the lower hot part 3 of the ampoule. The configuration shown in FIG. 4 is achieved conventionally by specialist glass blowers.

The significant advantage provided by the invention may be easily understood from reading the preceding description. Said invention can thus be used to synthesize and crystallize a semiconductor compound under controlled vapor pressure, first dry and then saturated, in a single ampoule and in a single operation, linking together without cooling and in the same equipment the stages of synthesis and then of crystallization, and finally of cooling under controlled cadmium vapor, and generally, of one of the constituents of the composite semiconductor material required.

The advantage in industrial and economic terms is therefore clear.

Furthermore, the invention may be implemented whatever the area of respective positioning of the material whether crystallized or in the process of crystallization and of the excess constituent pressure management area, in so far as when the load is in the liquid state, the excess of said excess constituent is again in the dry vapor state. The excess constituent pressure management area can thus be located above or below the charge, whatever growth mode is employed, in other words via the bottom or via the surface.

The invention claimed is:

1. A method for producing a crystallized compound semiconductor material of group II-VI, comprising synthesizing said material by fusion and inter-reaction of constituents of the material, said constituents being placed in elementary form constituting a charge into a sealed ampoule, then crystallizing the semiconductor material resulting from the synthesis in liquid form by cooling the ampoule according to a given temperature gradient, wherein the method further comprises:

increasing within the charge proportion of one constituent of the constituents of said material beyond stoichiometric proportions of the compound semiconductor material for synthesis, thereby defining an excess of the one constituent;

subjecting the sealed ampoule in its entirety so provided with the charge to a temperature higher than or equal to a fusion temperature of the compound semiconductor material for synthesis, inducing actual fusion of the charge and the inter-reaction of its constituents then in liquid form, and conversion to dry vapor of the excess of the one constituent;

then subjecting the ampoule to a low temperature gradient and to a gradual drop in said temperature, to induce crystallization of the resulting compound semiconductor material, then in liquid form, in stoichiometric proportion, the excess of said one constituent remaining in dry vapor form;

then, after crystallization and beginning of cooling of the semiconductor material, subjecting a part of the ampoule where the crystallized semiconductor material is not present, to a significant drop in temperature operable to modify the vapor pressure state of the excess of the one constituent in order to bring the vapor to a saturated vapor state;

and finally, cooling the whole of the ampoule down to ambient temperature.

2. The method for producing a crystallized compound semiconductor material as claimed in claim 1, wherein quantity of the excess of the one constituent is between two values:

a higher value, for which the quantity is at most equal to a quantity of said constituent that corresponds to establishment, for a temperature slightly higher than or equal to the fusion temperature of the compound semiconductor, of a high pressure of said constituent, then in dry vapor state, lower than a bursting pressure of the ampoule;

and a lower value, for which the quantity is at least equal to a quantity of said constituent that corresponds to establishment, for a temperature of between 400 and 800° C., of a saturated vapor pressure in the part of the ampoule where the crystallized semiconductor material is not present;

these two values being determined by applying Boyle-Mariotte law.

3. The method for producing a crystallized compound semiconductor material as claimed in claim 1, wherein the sealed ampoule comprises two areas that have two different diameters:

an area of larger diameter that receives the charge for crystallization;

an area of smaller diameter in continuity with the area of larger diameter, subjected to localized temperature management and consequently to the change from dry vapor to saturated vapor, of the vapor of the excess of the one constituent.

4. The method for producing a crystallized compound semiconductor material as claimed in claim 1, wherein the synthesized material comprises at least one of binary materials, ternary materials, and quaternary materials.

5. The method for producing a crystallized compound semiconductor material as claimed in claim 1, wherein the binary materials consist of at least one of CdTe and ZnTe, the ternary materials have a generic formula of CdZnTe or CdTeSe, and the quaternaty materials consist of CdZnteSe.

* * * * *